United States Patent
Shin et al.

(10) Patent No.: US 9,496,336 B2
(45) Date of Patent: *Nov. 15, 2016

(54) SEMICONDUCTOR DEVICE HAVING VERTICAL CHANNELS AND METHOD OF MANUFACTURING THE SAME

(71) Applicant: Samsung Electronics Co., Ltd., Suwon-si, Gyeonggi-do (KR)

(72) Inventors: Soo-ho Shin, Hwaseong-si (KR); Yong-sung Kim, Seoul (KR); Tae-young Chung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/750,027

(22) Filed: Jun. 25, 2015

(65) Prior Publication Data

US 2015/0318350 A1     Nov. 5, 2015

Related U.S. Application Data

(60) Continuation of application No. 14/109,517, filed on Dec. 17, 2013, now Pat. No. 9,099,325, which is a continuation of application No. 13/899,911, filed on May 22, 2013, now Pat. No. 8,637,934, which is a continuation of application No. 12/548,219, filed on Aug. 26, 2009, now Pat. No. 8,563,373, which is a division of application No. 11/457,781, filed on Jul. 14, 2006, now Pat. No. 7,598,571.

(30) Foreign Application Priority Data

Jul. 15, 2005  (KR) .................. 10-2005-0064067

(51) Int. Cl.
| | | |
|---|---|---|
| H01L 29/66 | (2006.01) | |
| H01L 29/06 | (2006.01) | |
| H01L 29/78 | (2006.01) | |
| H01L 27/088 | (2006.01) | |

(52) U.S. Cl.
CPC ......... *H01L 29/0649* (2013.01); *H01L 27/088* (2013.01); *H01L 27/0886* (2013.01); *H01L 29/66795* (2013.01); *H01L 29/7802* (2013.01); *H01L 29/785* (2013.01); *H01L 29/7827* (2013.01); *H01L 29/7851* (2013.01); *H01L 29/7853* (2013.01)

(58) Field of Classification Search
CPC ...................... H01L 29/785; H01L 29/66795
USPC ................... 257/365, 395–397, 510, E29.02
See application file for complete search history.

(56) References Cited

U.S. PATENT DOCUMENTS

| | | |
|---|---|---|
| 6,396,108 B1 | 5/2002 | Krivokapic et al. |
| 6,583,469 B1 | 6/2003 | Fried et al. |
| 6,972,226 B2 | 12/2005 | Deppe et al. |
| 7,335,564 B2 | 2/2008 | Kwon |
| 2005/0029583 A1 | 2/2005 | Popp et al. |
| 2005/0035391 A1 | 2/2005 | Lee et al. |
| 2005/0085042 A1 | 4/2005 | Chun et al. |
| 2005/0167750 A1 | 8/2005 | Yang et al. |
| 2006/0008993 A1 | 1/2006 | Song et al. |
| 2007/0004129 A1 | 1/2007 | Lee et al. |
| 2007/0246779 A1 | 10/2007 | Chun et al. |

FOREIGN PATENT DOCUMENTS

| | | |
|---|---|---|
| KR | 2004-0074501 | 8/2004 |

*Primary Examiner* — Julia Slutsker
(74) *Attorney, Agent, or Firm* — Myers Bigel, P.A.

(57) ABSTRACT

A method of manufacturing a semiconductor device which can prevent leakage current caused by gate electrodes intersecting element isolation layers in a major axis of an active region, and which further has vertical channels to provide a sufficient overlap margin, and a semiconductor device manufactured using the above method. The device includes gate electrodes formed on element isolation layers that are disposed between active regions and have top surfaces that are higher than the top surfaces of the active regions. Since the gate electrodes are formed on the element isolation layers, leakage current in a semiconductor substrate is prevented. In addition, the gate electrodes are formed using a striped shape mask pattern, thereby obtaining a sufficient overlap margin compared to a contact shape or bar shape pattern.

19 Claims, 19 Drawing Sheets

SEMICONDUCTOR DEVICE HAVING VERTICAL CHANNELS AND METHOD OF MANUFACTURING THE SAME

CROSS-REFERENCE TO RELATED PATENT APPLICATIONS

This application is a Continuation of U.S. Ser. No. 14/109,517, filed Dec. 17, 2013, which is a Continuation of U.S. Ser. No. 13/899,911, filed on May 22, 2013, now U.S. Pat. No. 8,637,934, which is a Continuation of U.S. Ser. No. 12/548,219, filed on Aug. 26, 2009, now U.S. Pat. No. 8,563,373, which is a Divisional of U.S. Ser. No. 11/457,781, filed on Jul. 14, 2006, now U.S. Pat. No. 7,598,571, which claims priority from Korean Patent Application No. 10-2005-0064067, filed on Jul. 15, 2005, all of which are hereby incorporated herein by reference in their entireties.

BACKGROUND OF THE INVENTION

1. Field of the Invention

The present invention relates to a semiconductor device and a method of manufacturing the same, and more particularly, to a semiconductor device having vertical channels and a method of manufacturing the same.

2. Description of the Related Art

As the length of a channel in a semiconductor device, for example, a field effect transistor (FET), decreases, several characteristics of the FET degrade. For example, short channel effects such as punch-through, drain induced barrier lowering (DIBL), and sub-threshold voltage swing occur. In addition, there are other problems such as an increase in parasitic capacitance (contact capacitance) between a contact region and a substrate, and an increase in leakage current.

In a FET including an active region having vertical channels on a semiconductor substrate, at least one side surface of a fin is used as a channel. A short channel effect can be prevented by an increase in the length of the channel, thereby improving current characteristics. Hereinafter, an active region having a vertical channel is referred to as a fin, and a FET having a fin is referred to as a fin-FET.

FIG. 1A is a plan view of a conventional fin-FET. FIG. 1B is a cross-sectional view of the conventional fin-FET taken along line 1B-1B of FIG. 1.

Referring to FIGS. 1A and 1B, an element isolation layer 20 which defines an active region 12 having vertical channels is formed on a semiconductor substrate 10. A gate electrode 16 covers the active region 12, an element isolation layer 21 is disposed along a minor axis of the active region 12, and an element isolation layer 22 is disposed along a major axis of the active region 12. For convenience, the gate electrodes 16 can be divided into a gate electrode 16a intersecting the active region 12 and a gate electrode 16b intersecting the element isolation layer 22 disposed along the major axis of the active region 12. Reference numeral 18 is an interlayer insulation layer including the gate electrode 16 therein.

The gate electrode 16b intersecting the element isolation layer 22 disposed along the major axis of the active region 12 contacts the sidewall of the active region 12 and is buried in the element isolation layer 22. When electric power is supplied to the buried gate electrode 16b, leakage current is generated in adjacent portions of the active region 12, i.e., portions "a" of the active region 12. The leakage current degrades the refresh characteristics of the memory device.

Fin-FETs in which the gate electrode 16b is not found on the element isolation layer 22 are disclosed are U.S. Pat. No. 6,396,108 and U.S. Pat. No. 6,583,469. In these disclosures, to prevent the formation of the gate electrode 16 on the element isolation layer 22, the gate electrode 16 has a contact shape or bar shape, and thus the gate electrode 16 cannot be formed on the element isolation layer 22 disposed along the major axis of the active region 12.

However, as the design rule decreases, it becomes difficult to form a contact shape or bar shape gate electrode pattern on a substrate. In particular, it is difficult to obtain an overlap margin during a photolithography process in which the gate electrode pattern is formed.

SUMMARY

The present invention provides a method of manufacturing a semiconductor device having vertical channels that can prevent leakage current caused by a gate electrode intersecting an element isolation layer extending along a major axis of an active region, and provide a sufficient overlap margin. The present invention also provides a semiconductor device manufactured using the above method.

According to an embodiment of the present invention, there is provided a method of manufacturing a semiconductor device having vertical channels, the method including: etching a semiconductor substrate to protrude a plurality of active regions that are adjacent to each other, forming filling material layers in element isolation regions by filling etched portions between the active regions, and forming a first mask pattern that extends in a first direction and covers at least a portion between adjacent active regions. In addition the method also includes forming a second mask pattern to extend in a second direction at a predetermined angle with respect to the first direction, removing an exposed portion of the filling material layers using the first and second mask patterns as etching masks, removing the first and second mask patterns, exposing the active regions disposed between the filling material layers, and forming gate electrodes on the exposed active regions.

BRIEF DESCRIPTION OF THE DRAWINGS

The above and other features and advantages of the present invention will become more apparent by describing in detail exemplary embodiments thereof with reference to the attached drawings in which:

FIGS. 2A through 8A are plan views illustrating a method of forming a fin-FET according to an embodiment of the present invention;

FIGS. 2B through 6B are cross-sectional views illustrating the method of FIGS. 2A through 6A, respectively, taken along line A-A of FIG. 2A;

FIGS. 2C through 8C are cross-sectional views illustrating the method of FIGS. 2A through 8A, respectively, taken along line B-B of FIG. 2A;

FIGS. 2D through 8D are cross-sectional views illustrating the method of FIGS. 2A through 8A, respectively, taken along line C-C of FIG. 2A;

DETAILED DESCRIPTION

Figure 1A:
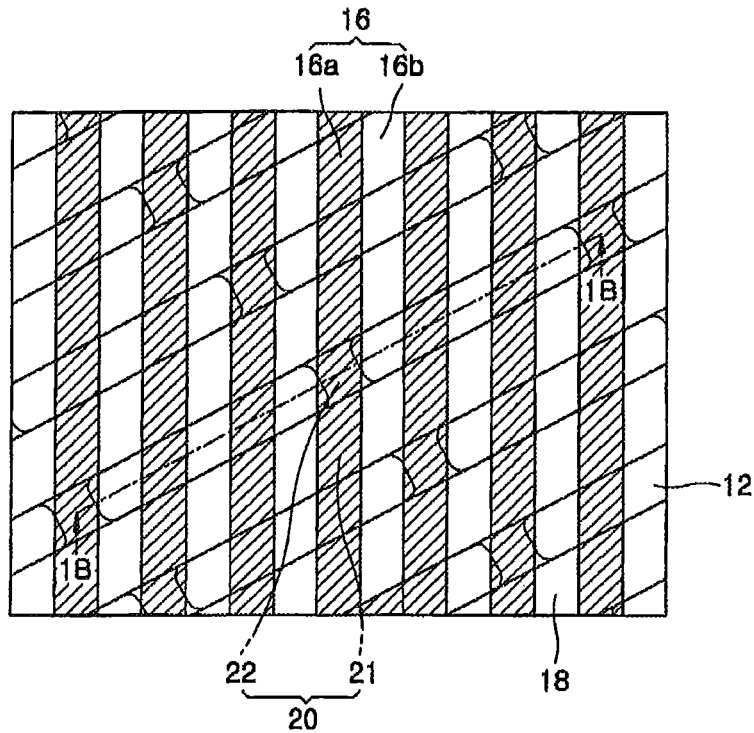
FIG. 1A is a plan view of a conventional fin-FET.
Figure 1B:
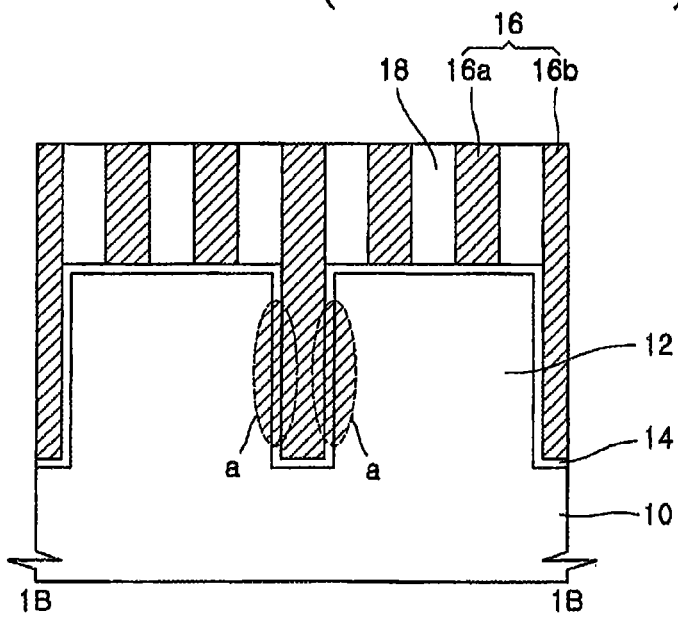
FIG. 1B is a cross-sectional view taken along line 1B-1B of FIG. 1.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements, and the sizes and thicknesses of layers and regions are exaggerated for clarity. It will also be understood that when a layer is referred to as being "on" another layer or substrate, it can be directly on the other layer or substrate, or intervening layers may also be present. In the descriptions, like reference numerals denote like elements.

In some embodiments of the present invention, a gate electrode is formed on an element isolation layer disposed along a major axis of an active region in a fin-FET using a line shaped mask pattern. The bottom portion of the gate electrode is filled with filling material layer, thereby preventing leakage current in a semiconductor substrate due to the gate electrode.

In some embodiments of the present invention, the gate electrode is formed using a damascene process. In addition, a fin-FET according to an embodiment of the present invention may have a double gate electrode formed using the damascene process or have a triple gate electrode formed using the damascene process.

FIGS. 2A through 8A are plan views illustrating a method of forming a fin-FET according to an embodiment of the present invention. FIGS. 2B through 6B are cross-sectional views illustrating the method of FIGS. 2A through 6A, respectively, taken along line A-A of FIG. 2A. FIGS. 7B and 8B are cross-sectional views illustrating the method of FIGS. 7A and 8A, respectively, taken along line A'-A' of FIG. 2A. FIGS. 2C through 8C are cross-sectional views illustrating the method of FIGS. 2A through 8A, respectively, taken along line B-B of FIG. 2A. FIGS. 2D through 8D are cross-sectional views illustrating the method of FIGS. 2A through 8A, respectively, taken along line C-C of FIG. 2A.

Referring to FIGS. 2A through 2D, a device isolation layer or an element isolation layer 112, which defines an active region 102 having vertical channels, is formed on a semiconductor substrate 100. In a method of forming the element isolation layer 112, mask layers 105, defining the element isolation layer 112 and each including a pad oxide layer 104 and a pad nitride layer 106, are formed on the semiconductor substrate 100 using a conventional photolithography process. The pad oxide layers 104 are formed to reduce stress between the substrate 100 and the pad nitride layers 106, and may have a thickness of about 20 to about 200 Å, and preferably about 100 Å. The pad nitride layers 106 are used as a hard mask when etching to form a recessed region 113 and is deposited to a thickness of about 500 to about 2,000 Å, and preferably about 800 to about 850 Å. The deposition method for the pad nitride layers 106 may be a conventional method, such as chemical vapor deposition (CVD), sub-atmospheric CVD (SACVD), low pressure CVD (LPCVD), or plasma enhanced CVD (PECVD).

The semiconductor substrate 100 is exposed using an anisotropic dry etching method. The semiconductor substrate 100 is then etched to a predetermined depth using the mask layers 105 as an etching mask to form recessed regions 113. A photoresist pattern (not illustrated) is removed using conventional methods, such as ashing using oxygen plasma or organic stripping. The recessed region 113 is formed to a sufficient depth to isolate elements. Next, sidewall oxide layers 108 are formed on the entire surface of the recessed region 113. The sidewall oxide layers 108 are formed on the inner walls and bottom of the recessed region 113 to compensate for the damage caused during the etching process used in forming the recessed region 113. The sidewall oxide layer 108 is a thermal oxide layer or a CVD oxide layer, and may have a thickness of about 20 to about 200 Å.

Next, a nitride layer liner 110 covering the sidewall oxide layer 108 and the exposed mask layer 105 is deposited. The nitride layer liner 110 may be formed along the inner surfaces of the recessed region 113. The nitride layer liner 110 prevents oxidization of the sidewall oxide layer 108 in subsequent processes and improves the insulating characteristics of a later formed element isolation layer. The nitride layer liner 110 is formed to a thickness of about 50 to about 300 Å using CVD. A capping layer (not illustrated) may be formed on the nitride layer liner 110. The capping layer prevents damage to the nitride layer liner 110 in subsequent processes and may be formed of middle temperature oxide (MTO).

The forming of the nitride layer liner 110 can be omitted, if desired. In addition, the pad nitride layers 106 may be removed, or may remain to prevent damage to the active regions 102 in subsequent processes.

The recessed regions 113 are filled with a filling material layer. The filling material layer is an insulation layer and may be chosen from an undoped silicate glass (USG) layer, an high-density plasma (HDP) oxide layer, a tetraethylorthosiliate (TEOS) layer formed using PECVD, and an oxide layer formed using PECVD. The HDP oxide layer, which is a thin layer, may be the most suitable for reclaiming the recessed regions 113. The HDP CVD process may be a combination of a CVD process and an etching process using sputtering. In the HDP CVD process, a depositing gas for depositing a material layer and a sputtering gas with which a deposited material layer is etched via sputtering are supplied into a chamber. In an embodiment of the present invention, $SiH_4$ and $O_2$ are supplied into the chamber as depositing gases and an inert gas, such as an argon gas, is supplied into the chamber as the sputtering gas. Some of the supplied depositing gas and sputtering gas is ionized by plasma induced by high frequency electric power in the chamber. Biased high frequency electric power is supplied to a wafer chuck, i.e., an electrostatic chuck, in the chamber where the substrate is loaded, thus accelerating the ionized depositing gas and sputtering gas to the surface of the substrate. The accelerated depositing gas ions form a silicon oxide layer, and the accelerated sputtering gas ions sputter the deposited silicon oxide layer. Therefore, the element isolation layer 112 formed of HDP oxide is thin and has good gap fill characteristics.

The recessed region 113 filled with the filling material layer is then planarized until the top surface of the nitride layer liner 110 is exposed to form the element isolation layer 112. The planarization process may be performed using chemical mechanical polishing (CMP) or an etch-back process. In the planarization process, the nitride layer liner 110 is used as a planarization stopper. For example, when the planarization process is performed using CMP, the nitride layer liner 110 acts as a CMP stopper. A slurry used during CMP may etch the element isolation layers 112, for example, the HDP oxide layer, faster than the nitride layer liner 110. Accordingly, a slurry including a seria group abrasive may be used.

Referring to FIGS. 3A through 3D, a first mask pattern 114 covering the major axis of the active region 102 is formed. The first mask pattern 114 may cover first element isolation layers 120 (see FIG. 7A) between the adjacent active regions 102 along the direction of the major axis of the active region. The first mask pattern 114 may be arranged in stripes. To form the first mask pattern 114, a mask material layer is formed on the element isolation layer 112 and the active regions 102. Next, a photoresist pattern (not illustrated) defining the first mask pattern 114 covering the major axis of the active region 102 is defined. The mask material layer is etched in the shape of the photoresist pattern to form the first mask pattern 114.

The first mask pattern 114 is used as a hard mask for forming gate electrodes and has a sufficient etch selectivity to the element isolation layer 112. For example, if the element isolation layer 112 is a silicon oxide layer, the first mask pattern 114 may be a silicon nitride layer. The first mask pattern 114, e.g., the silicon nitride layer, may be deposited to a thickness of about 2,000 to about 6,000 Å, and preferably about 3,500 to about 4,500 Å. The deposition method may be a conventional method, for example, CVD, SACVD, LPCVD, or PECVD.

The width of the first mask pattern 114 is equal to or less than the width of the active region 102. For example, the width of the first mask pattern 114 may be about 1 to about 15 nm less than the width of the active region 102, and preferably about 3 to about 8 nm less than the width of the active region 102, thereby enhancing an overlap. However, when the width of the first mask pattern 114 is less than this, a portion of the first element isolation region 120 along the major axis of the active region 102 may be etched. To prevent a portion of the first element isolation region 120 from being etched, auxiliary patterns may be further formed to correspond to the first element isolation layer 120 on both sides of a portion of a reticle used to form the first mask pattern 114.

Although not illustrated in detail in the drawings, the first mask pattern 114 may be formed from one end of a plurality of the active regions 102 to another end of a plurality of the active regions 102. For example, the arrangement of the plurality of the active regions 102 may be continuous from one end to another end of a cell region.

The process margin of the first mask pattern 114 having a line shape for forming a gate electrode is greater than the process margin of a mask pattern with a contact shape or a bar shape. Due to the large process margin, greater integration can be obtained, and thus the wavelength of the light source of a light emitting apparatus can be increased or a light emitting apparatus having a conventional light source and the number of apertures can be used without increasing the number of apertures. Accordingly, the first mask pattern 114 having a line shape can be efficiently applied to the formation of a fine pattern. In addition, the first mask pattern 114 having a line shape can prevent the generation of striation during the formation of the gate electrode, and thus an additional hard mask for removing the striation is unnecessary.

Referring to FIGS. 4A through 4D, filling layers 116 are formed on the element isolation layer 112 to fill the space between the first mask patterns 114, if desired. Each of the filling layers 116 may be an insulation layer chosen from an USG layer, an HDP oxide layer, a TEOS layer formed using PECVD, and an oxide layer formed using PECVD. However, since the element isolation layers 112 and the filling layers 116 may be simultaneously removed in a subsequent process, the element isolation layers 112 and the filling layers 116 may be formed of substantially the same material. For example, the element isolation layers 112 and the filling layers 116 may both be HDP oxide layers.

The filling layers 116 are planarized to the top surface of the first mask pattern 114. The planarization process is performed using CMP or an etch-back process. In the planarization process, the first mask pattern 114 is used as a planarization stopper layer. For example, when the filling layers 116 are planarized using the CMP, the first mask pattern 114 acts as a CMP stopper. A slurry used during the CMP may etch the filling layers 116, for example, the HDP oxide layer, faster than the first mask pattern 114. A slurry including a seria group abrasive may be used. Here, the filling layers 116 are used for the planarization, and thus are optionally formed.

Referring to FIGS. 5A through 5D, a second mask pattern 118, i.e., a photoresist pattern, is formed. The second mask pattern 118 extends at a predetermined transverse angle, for example, a right angle or an acute angle, with respect to the major axis of the active region 102, and includes stripes separated from each other by a predetermined distance. The second mask pattern 118 exposes portions of top surfaces of the filling layers 116 and portions of the first mask pattern 114.

Referring to FIGS. 6A through 6D, portions of the element isolation layers 112 along the minor axis of the active regions 102 are removed using the second mask pattern 118 and the first mask pattern 114 as an etching mask to form second element isolation layers 122. That is, portions of the filling layers 116 and the element isolation layers 112 disposed along the minor axis of the active regions 102 are removed by wet etching. For example, when the element isolation layers 112 and the filling layers 116 are HDP oxide layers, they can be removed using a buffered oxide etchant (BOE), which is a mixed solution of diluted HF, NH$_4$F, or HF and ionized water.

Figure 2A:
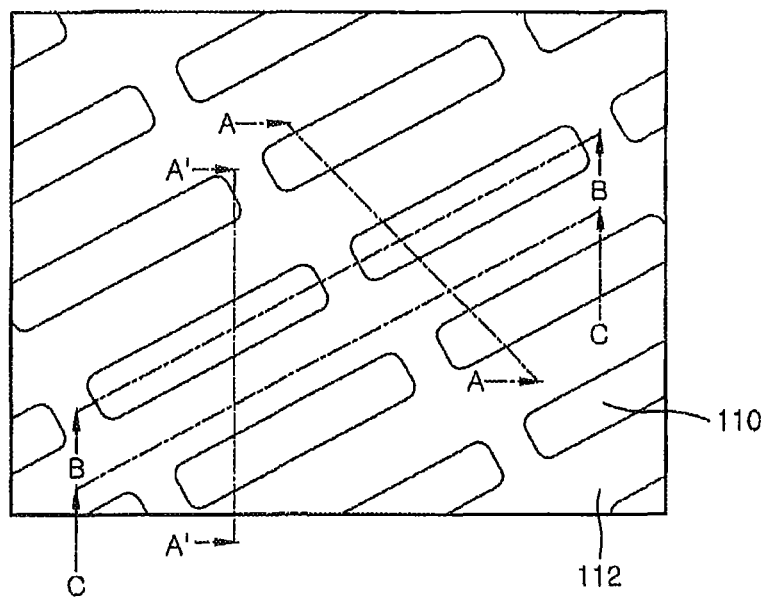
Figure 2B:
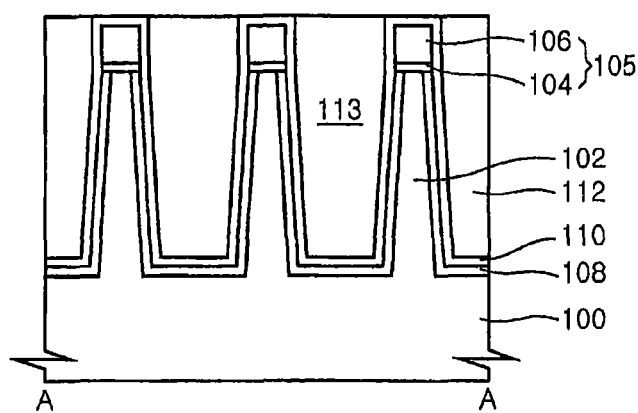
Figure 2C:
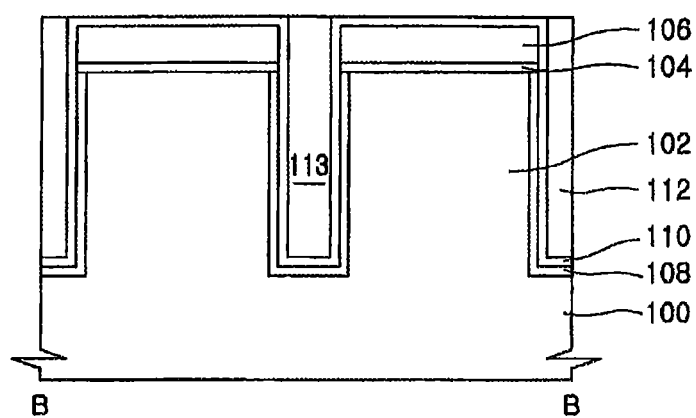
Figure 2D:
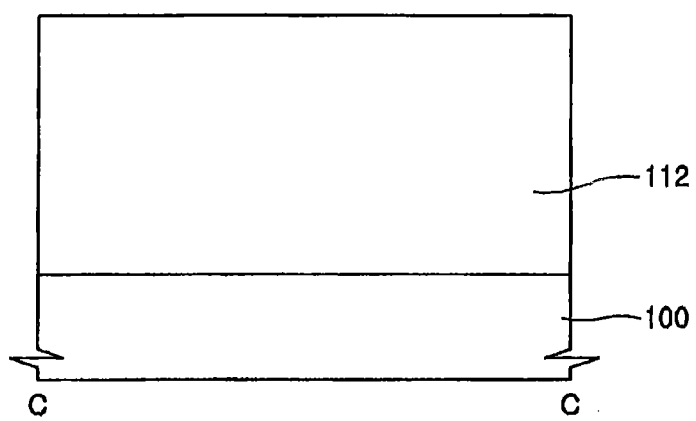
Figure 3A:
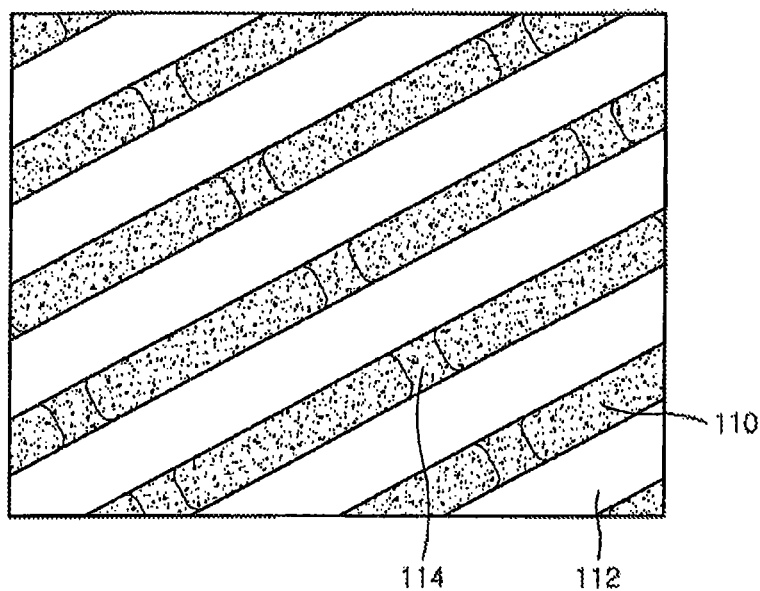
Figure 3B:
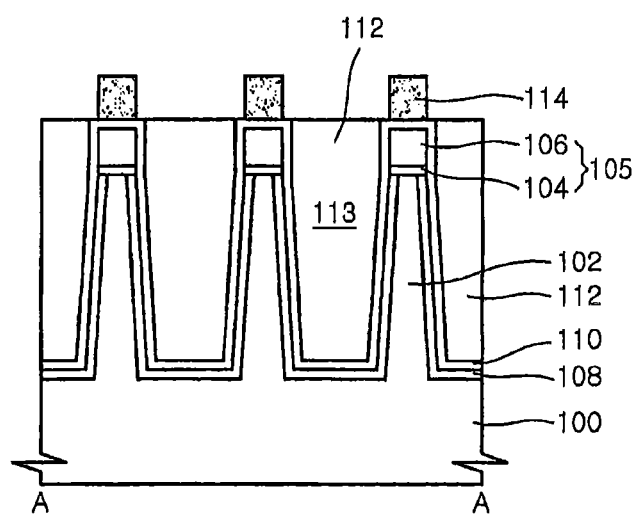
Figure 3C:
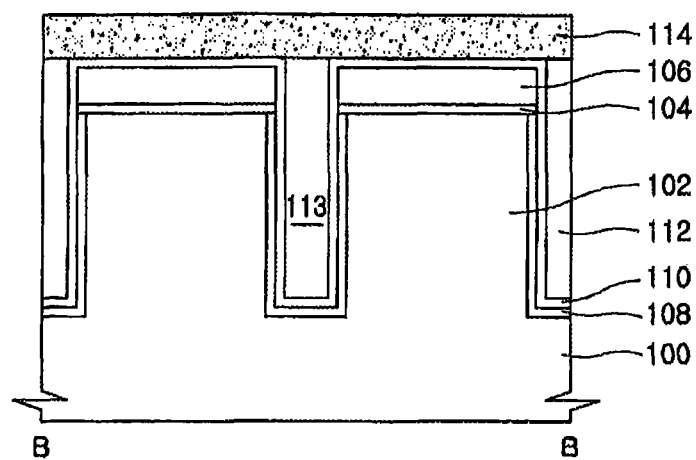
Figure 3D:
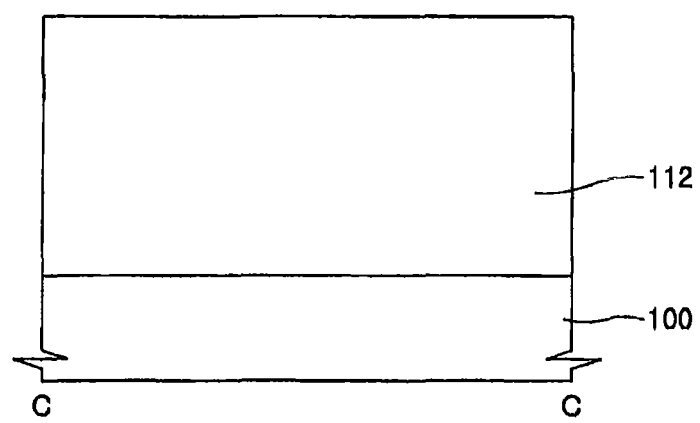
Figure 4A:
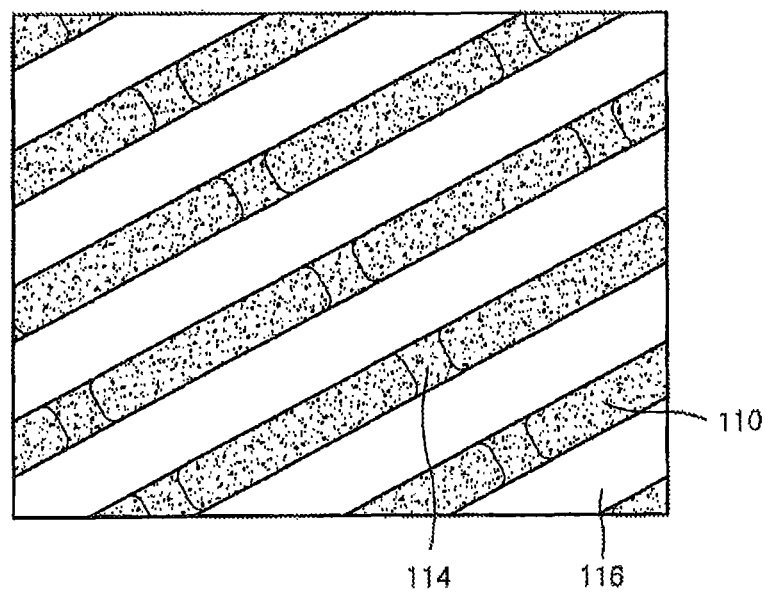
Figure 4B:
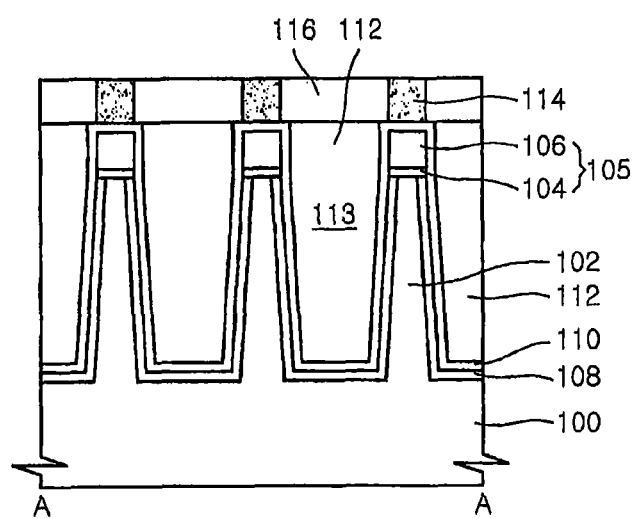
Figure 4C:
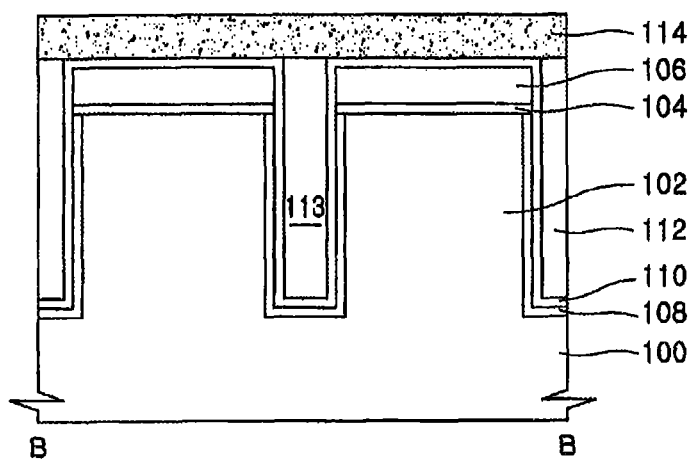
Figure 4D:
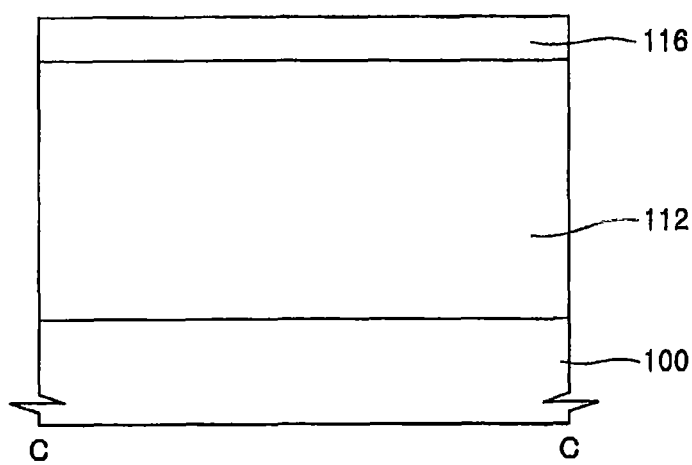
Figure 5A:
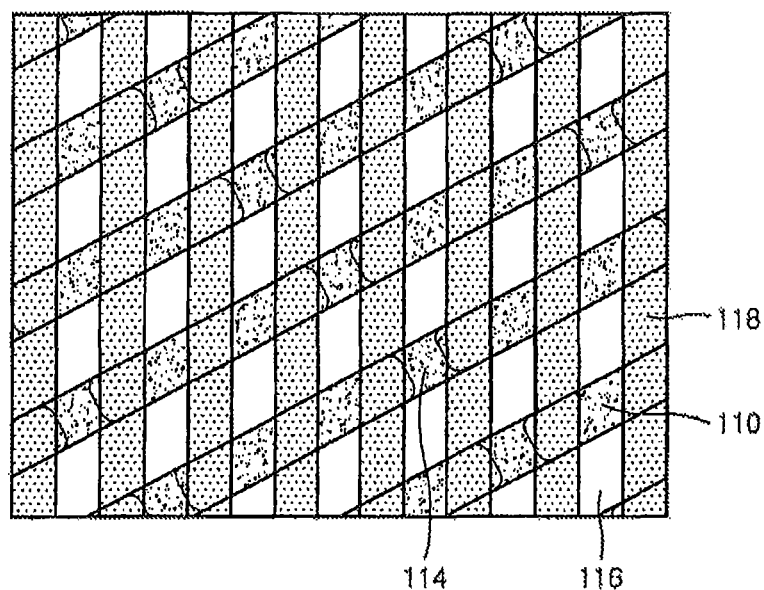
Figure 5B:
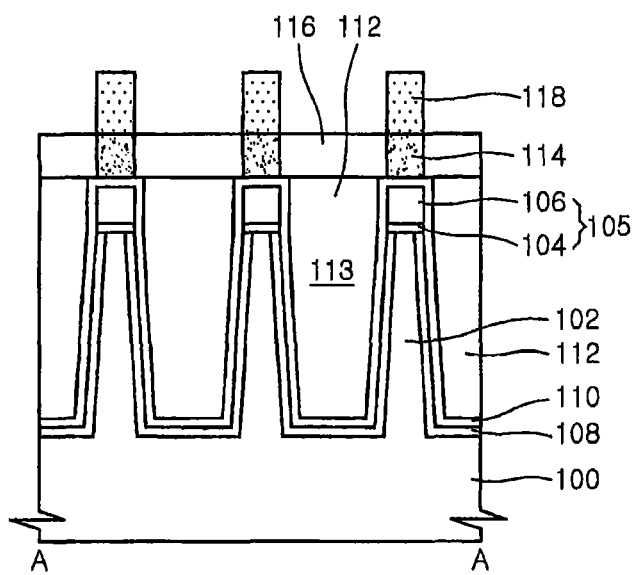
Figure 5C:
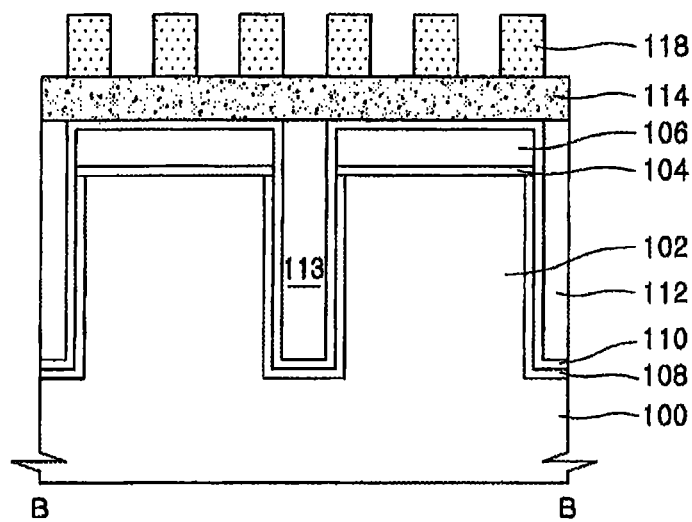
Figure 5D:
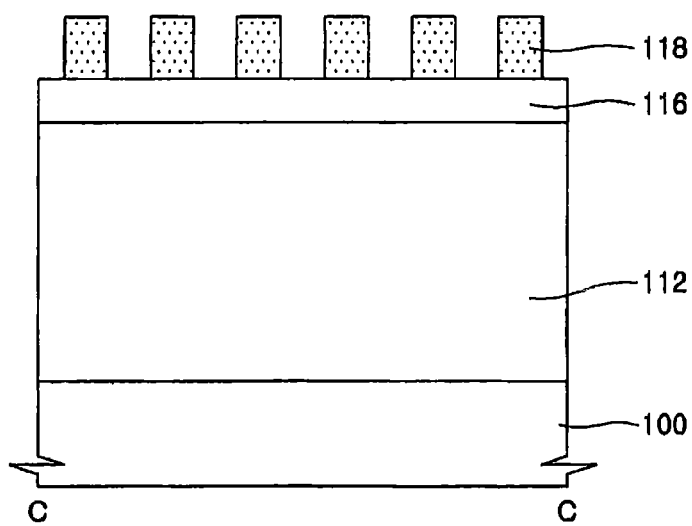
Figure 6A:
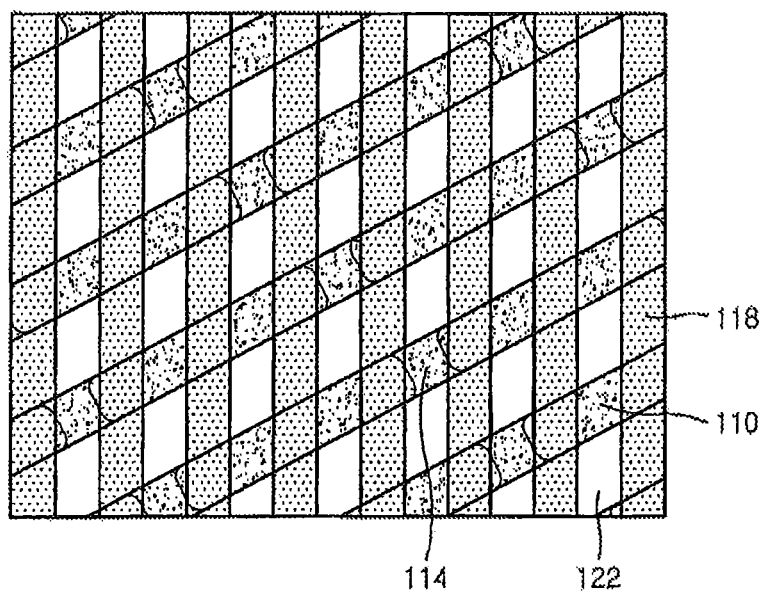
Figure 6B:
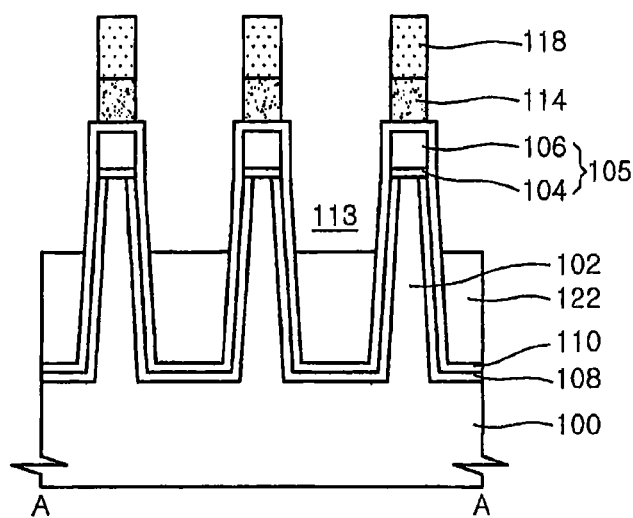
Figure 6C:
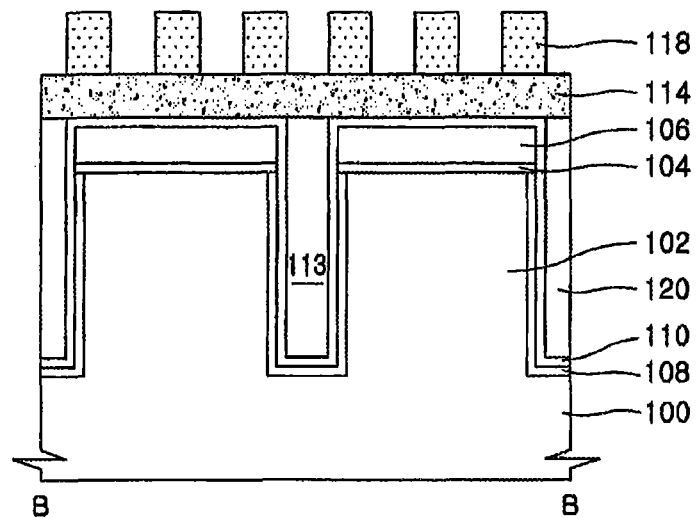
Figure 6D:
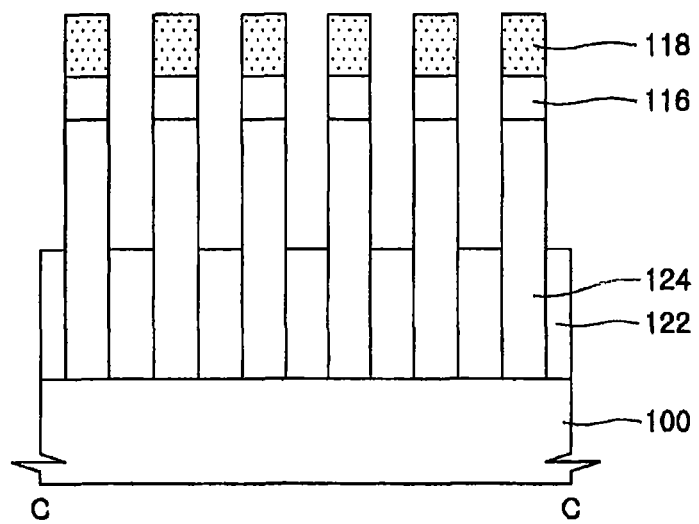
Figure 7A:
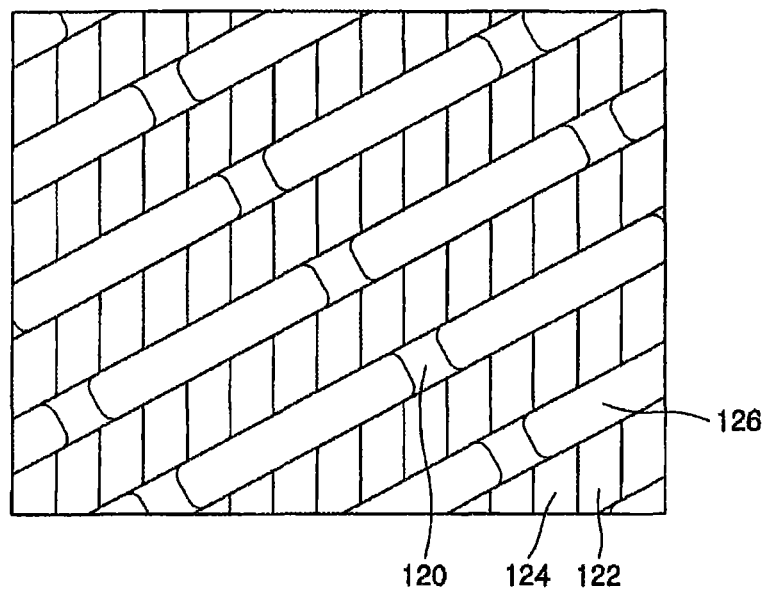
Figure 7B:
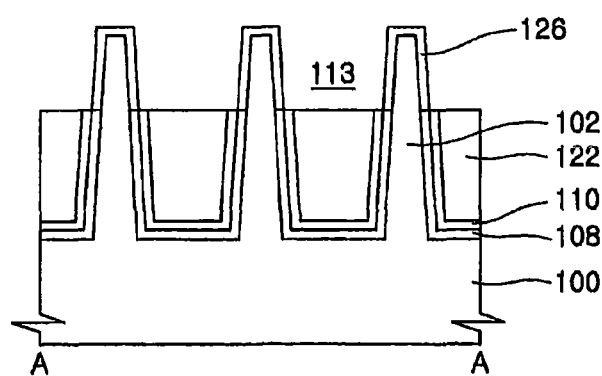
FIGS. 7B and 8B are cross-sectional views illustrating the method of FIGS. 7A and 8A, respectively, taken along line A'-A' of FIG. 2A.
Figure 7C:
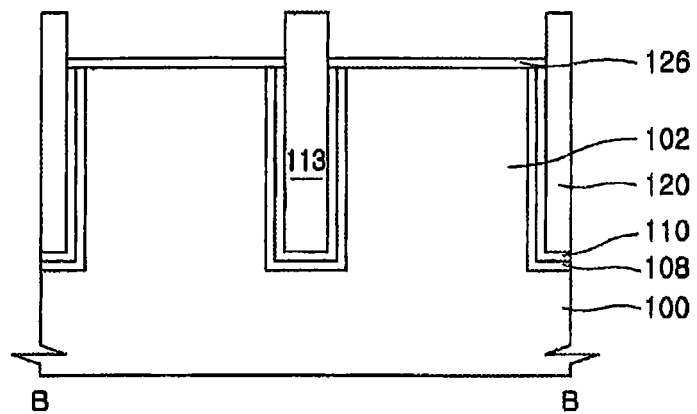
Figure 7D:
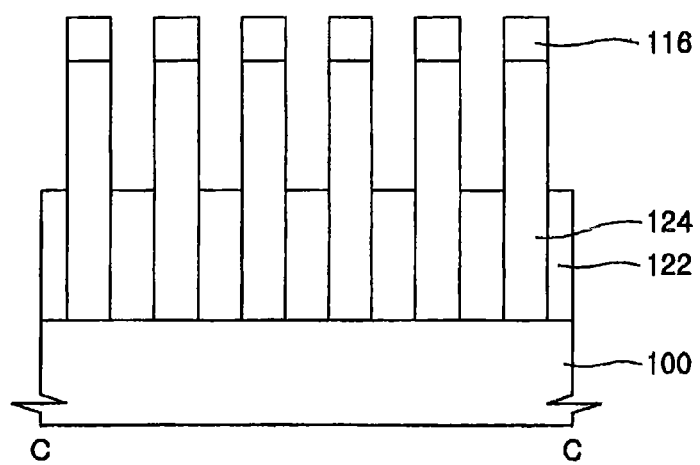
Figure 8A:
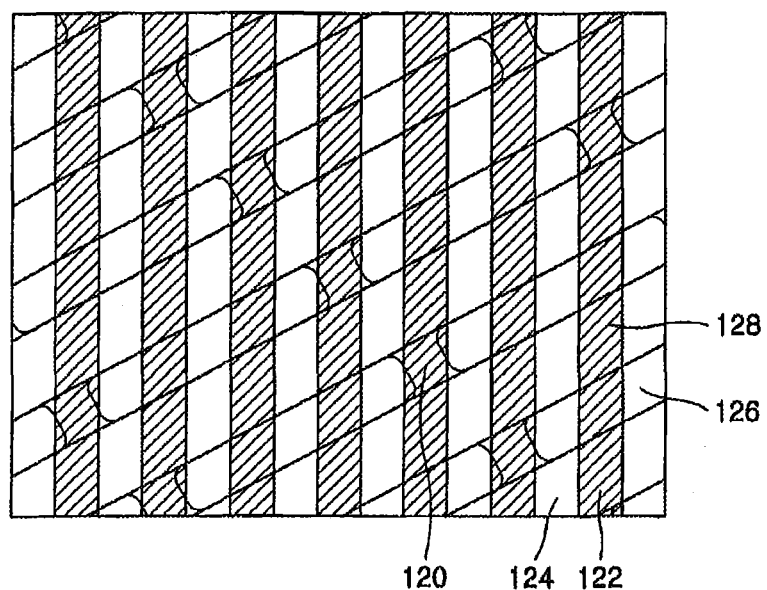
Figure 8B:
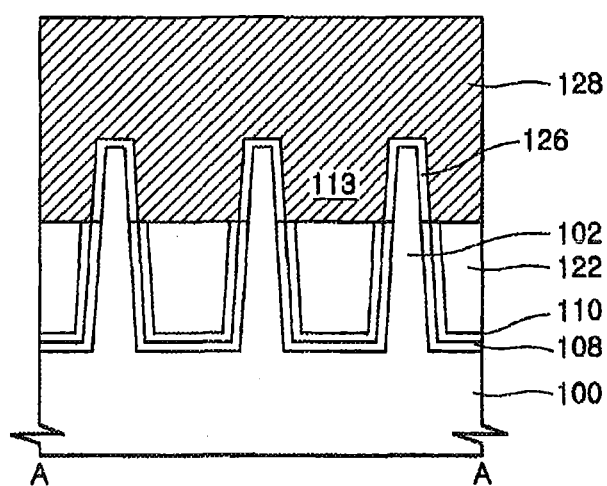
Figure 8C:
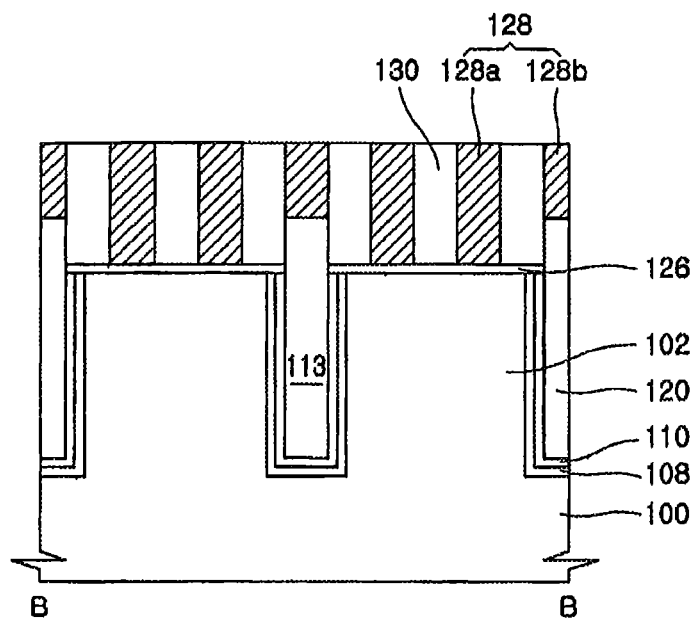
Figure 8D:
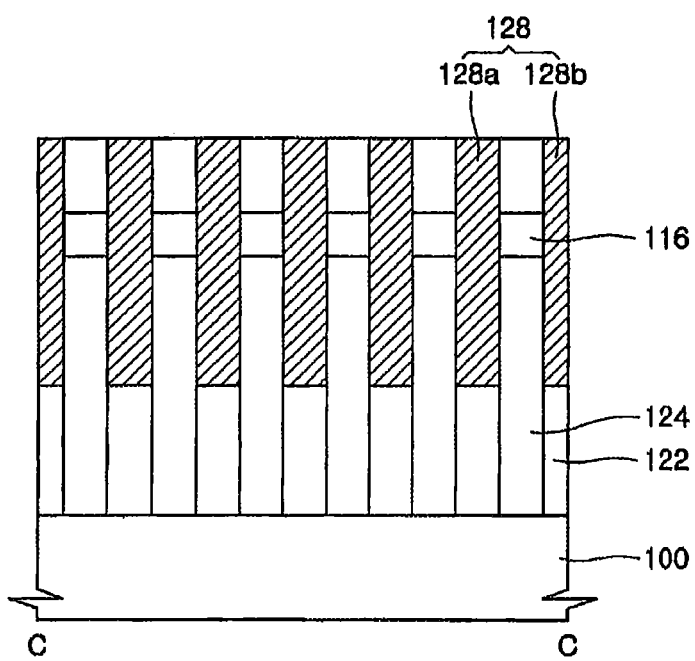

In an embodiment of the present invention, a first direction is defined along a major axis of the active region, for example, a direction in which line B-B of FIG. 2A extends. A first element isolation region 120 (FIG. 6C) disposed between the active regions extends along the first direction. A second direction may be along a minor axis of the active region, for example, a direction in which line A-A of FIG. 2A extends. An element isolation region disposed between active regions extends along the second direction. In other words, the element isolation region extending along the second direction may be an element isolation region disposed in a region in which the line C-C of FIG. 2A extends. The element isolation region extending along the second direction can be divided into a second element isolation region 122 which is recessed and a third element isolation region 124 which is not recessed. Thus, the element isolation layer may be divided into the first, second, and third element isolation regions (120, 122 and 124 respectively of FIGS. 6B, 6C and 6D) for convenience of explanation and ease of understanding, not for limiting the scope of the present invention.

Here, the degree to which the element isolation layers 112 are removed determines the channel lengths of the fin-FET according to this embodiment of the present invention. The recess depth is sufficient to isolate the adjacent active regions 102. As a result of the etching, a first element isolation layer 120 is formed between the active regions 102 along the first direction, and recessed second element isolation layers 122 and unrecessed third element isolation layers 124 are alternately disposed along the second direction.

Referring to FIGS. 7A through 7D, the active regions 102 disposed between the second element isolation layers 122 are exposed. Specifically, the first mask pattern 114, the nitride layer liner 110, the mask layers 105, and the sidewall oxide layers 108, which cover the active regions 102, are removed. The exposure of the active regions 102 includes three operations because the nitride layer liners 110 disposed between the second element isolation layers 122 and the active regions 102 may be damaged in the processes of removing several layers, resulting in the generation of humps. A hump can generate leakage current and thus degrade current characteristics.

First, the first mask pattern 114, the nitride layer liner 110, and the pad nitride layers 106 disposed on the active regions 102 are removed by anisotropic dry etching. The nitride layers, i.e., the first mask pattern 114, the nitride layer liners 110, and the pad nitride layers 106, can be removed using a fluoride carbon group gas such as a $C_xF_y$ group gas and a $C_aH_bF_c$ group gas, for example, $CF_4$, $CHF_3$, $C_2F_6$, $C_4F_8$, $CH_2F_2$, $CH_3F$, $CH_4$, $C_2H_2$, $C_4F_6$, or a combination thereof. Argon gas may be used as an environmental gas.

Second, the portions of the nitride layer liner 110 remaining on the sidewalls of the active regions 102 are removed by isotropic wet etching using $H_3PO_4$. Third, the sidewall oxide layers 108 and the pad oxide layers 104 are removed by isotropic wet etching. Here, a BOE including a mixed solution of diluted HF, $NH_4F$, or HF and ionized water may be used as an etching solution.

When the surfaces of the active regions 102 are exposed, gate insulation layers 126 covering the active regions 102 are formed. The gate insulation layer 126 may be a silicon oxide layer, a hafnium oxide layer, a zirconium oxide layer, an aluminum oxide layer, a tantalum oxide layer, or a lanthanum oxide layer, which is deposited using CVD or ALD.

Referring to FIGS. 8a through 8D, gate electrodes 128 which fill the recessed regions on the second element isolation layers 122 and cover portions of the active regions 102 and the first element isolation layers 120 are formed. Specifically, the gate electrodes 128 are deposited to fill the spaces above the second element isolation layers 122 and completely cover the top surface. The gate electrodes 128 are patterned using conventional photolithography so as to extend at a predetermined angle, for example, a right angle or an acute angle, with respect to the major axis of the active region 102, and are separated from each other by a predetermined distance. The gate electrodes 128 are electrically insulated from each other by interlayer insulation layers 130. The gate electrodes 128 may have the same 2-dimensional shape as the second mask patterns 118 in FIG. 5.

The gate electrodes 128 according to this embodiment of the present invention are formed using a damascene process. Accordingly, an overlap margin required to form the gate electrodes 128 is sufficient. That is, the gate electrodes 128 fill the spaces above the second element isolation layer 122 and cover the top surface and both side surfaces of the active regions 102. The fin-FET according to the first embodiment of the present invention has a triple gate structure in which the gate electrodes 128 cover the top surface and both side surfaces of the active regions 102.

Each of the gate electrodes 128 may include a polysilicon layer, a silicide layer, and a capping insulation layer sequentially stacked. However, instead of the polysilicon layer, a monolayer or a multilayer composed of amorphous silicon, poly Si—Ge, and/or a material including metal can be used. The material including metal may include a metal such as tungsten or molybdenum or may include a conductive metal nitride, such as titanium nitride, tantalum nitride, or tungsten nitride. The silicide layer may or may not be included. The capping insulation layer may comprise a material having a sufficient etch selectivity to an interlayer insulation layer which is deposited in a subsequent process, and may be, for example, a silicon nitride layer.

For convenience, the gate electrodes 128 can be divided into first electrodes 128a intersecting the active regions 102 and second electrodes 128b intersecting the first element isolation layer 120 disposed along the first direction. The top surfaces of the first element isolation layers 120 are at the same level or higher than the top surfaces of the active regions 102. The second electrodes 128b are disposed on the first element isolation layers 120, and thus the generation of leakage current in the semiconductor substrate 100 due to the electric power supplied to the second electrodes 128b can be prevented because the electric field formed by the second electrodes 128b is blocked by the first element isolation layers 120. Meanwhile, both ends of the second electrodes 128b are connected to the gate electrodes disposed on the second element isolation layers 122 to be extended.

Figure 9A:
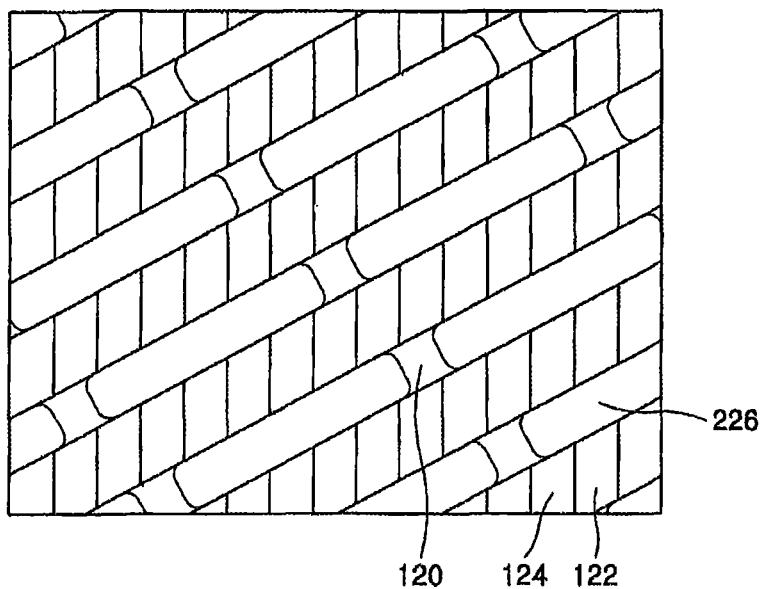
FIGS. 9A and 10A are plan views illustrating a method of forming a fin-FET according to another embodiment of the present invention.
Figure 9B:
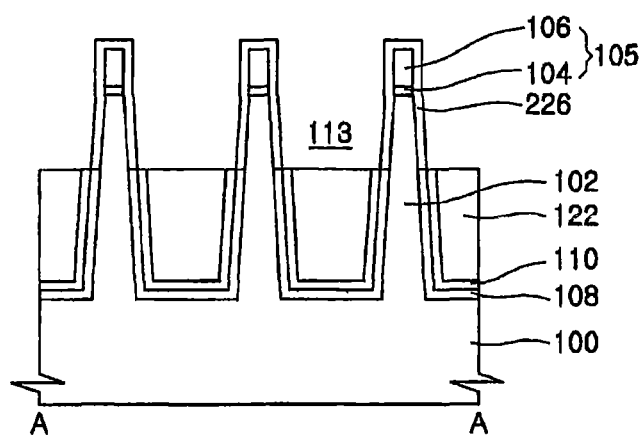
FIGS. 9B and 10B are cross-sectional views illustrating the method of FIGS. 9A and 10A, respectively, taken along line A'-A' of FIG. 2A.
Figure 9C:
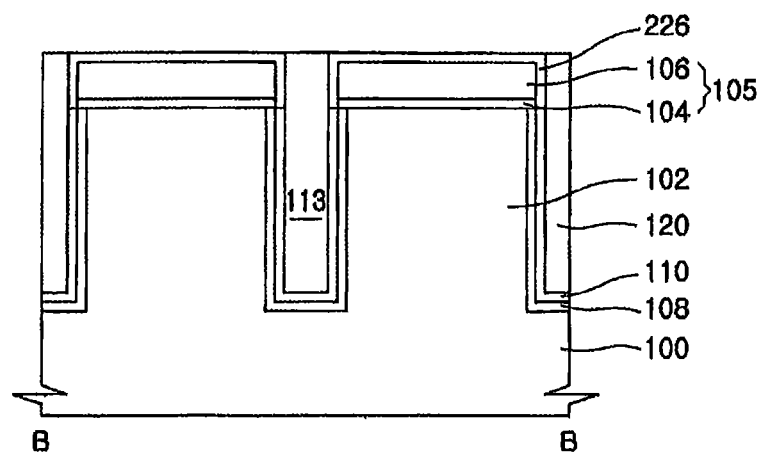
FIGS. 9C and 10C are cross-sectional views illustrating the method of FIGS. 9A and 10A, respectively, taken along line B-B of FIG. 2A.
Figure 9D:
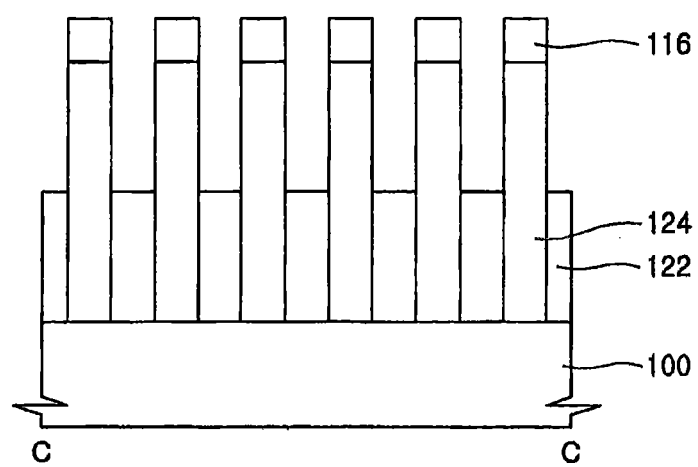
FIGS. 9D and 10D are cross-sectional views illustrating the method of FIGS. 9A and 10A, respectively, taken along line C-C of FIG. 2A.
Figure 10A:
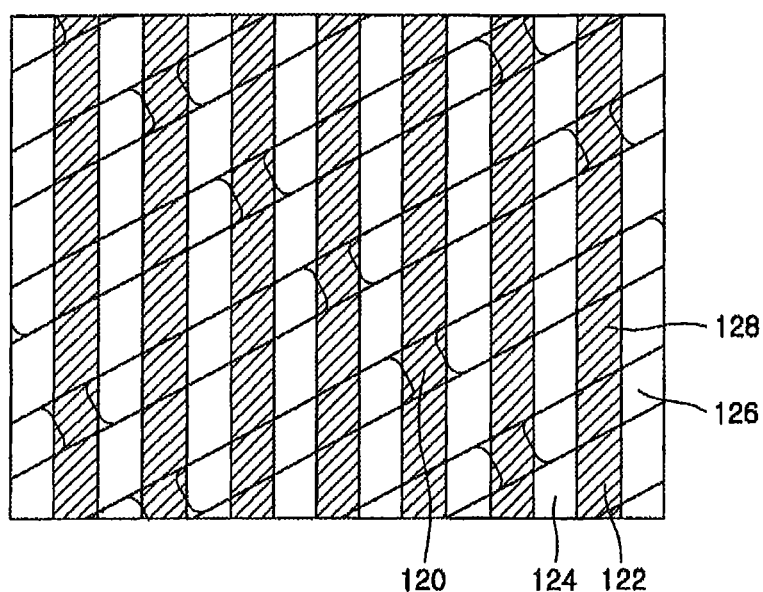
Figure 10B:
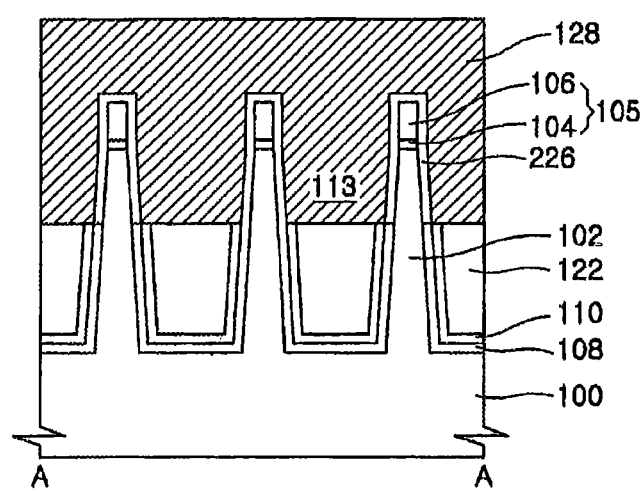
Figure 10C:
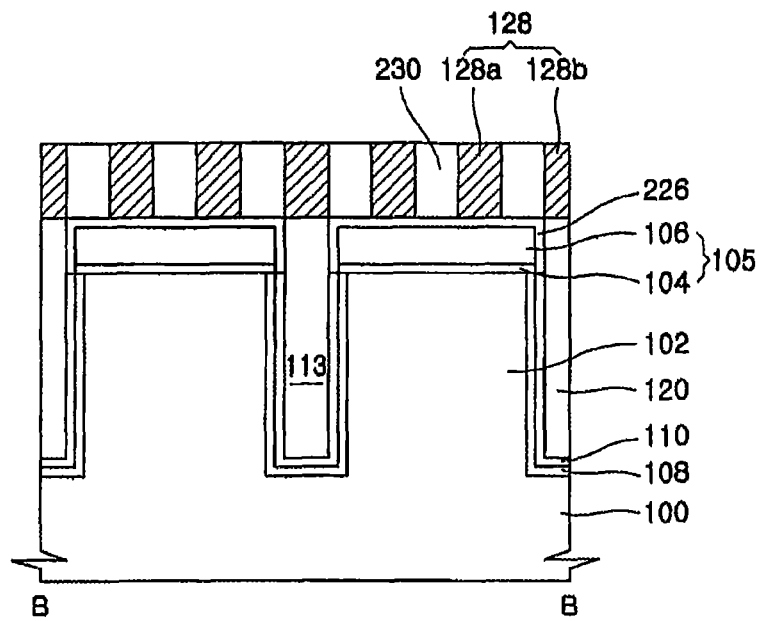
Figure 10D:
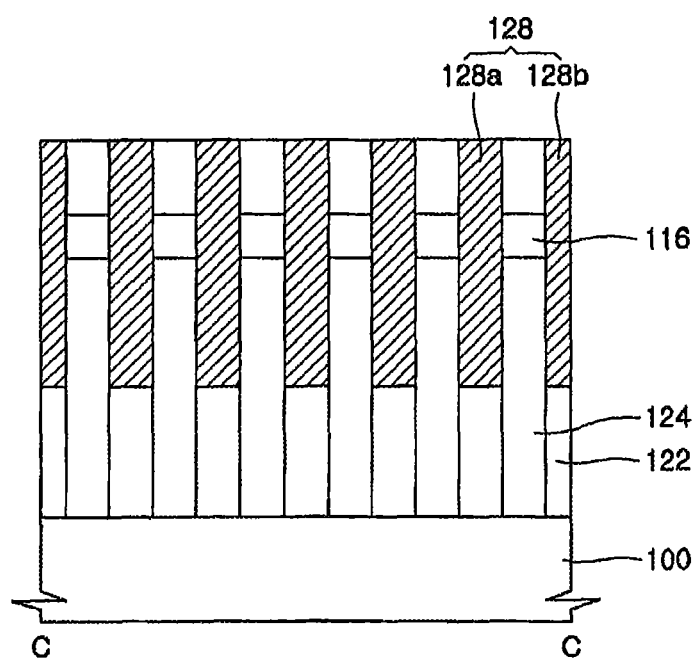

FIGS. 9A and 10A are plan views illustrating a method of forming a fin-FET according to another embodiment of the present invention. FIGS. 9B and 10B are cross-sectional views illustrating the method of FIGS. 9A and 10A, respectively, taken along line A'-A' of FIG. 2A. FIGS. 9C and 10C are cross-sectional views illustrating the method of FIGS. 9A and 10A, respectively, taken along line B-B of FIG. 2A. FIGS. 9D and 10D are cross-sectional views illustrating the method of FIGS. 9A and 10A, respectively, taken along line C-C of FIG. 2A.

Since the defining of the active region 102 and the forming of the first mask pattern 114 is the same as in the first embodiment as illustrated in FIGS. 2A through 6D, a description thereof will not be provided for the present embodiment.

Referring to FIGS. 9A through 9D, the active regions 102 disposed between the second element isolation layers 122 are exposed. Specifically, the first mask pattern 114, the nitride layer liner 110, portions of the pad nitride layers 106, and the sidewall oxide layers 108 which cover the active regions 102 are removed. The exposure of the active region 102 includes three operations because the nitride layer liners 110 disposed between the second element isolation layers 122 and the active regions 102 may be damaged in the process of removing several layers, resulting in the generation of humps. The hump can generate leakage current and thus degrade current characteristics.

First, the first mask pattern 114 and the nitride layer liner 110 disposed on the active regions 102 are removed by anisotropic dry etching. The nitride layers, i.e., the first mask pattern 114 and the nitride layer liner 110, can be removed using a fluoride carbon group gas such as $C_xF_y$ group gas and a $C_aH_bF_c$ group gas, for example, $CF_4$, $CHF_3$, $C_2F_6$, $C_4F_8$, $CH_2F_2$, $CH_3F$, $CH_4$, $C_2H_2$, $C_4F_6$, or a combination thereof Argon gas may be used as an environmental gas. The mask layer 105 may not be etched, or the upper portion of the mask layer 105 may be etched to a predetermined height.

Second, portions of the nitride layer liner 110 remaining on the sidewalls of the active regions 102 are removed by isotropic wet etching using $H_3PO_4$. Third, the sidewall oxide layers 108 and the pad oxide layers 104 are removed by isotropic wet etching. Here, a BOE being a mixed solution of diluted HF, $NH_4F$, or HF and ionized water may be used as an etching solution.

When the side surfaces of the active regions 102 are exposed, gate insulation layers 226 are formed to cover the active regions 102 and mask layers 105, including the residual pad nitride layers. The gate insulation layer 226 may be a silicon oxide layer, a hafnium oxide layer, a zirconium oxide layer, an aluminum oxide layer, a tantalum oxide layer, or a lanthanum oxide layer deposited using CVD or ALD.

Referring to FIGS. 10A through 10D, gate electrodes 128 which fill the recessed regions on the second element isolation layers 122 and cover portions of the active regions 102 and the first element isolation layers 120 are formed. Specifically, the gate electrodes 128 are deposited to fill the spaces above the second element isolation layers 122 and to completely cover the top surface. The gate electrodes 128 are patterned using conventional photolithography so as to extend at a predetermined angle, for example, a right angle or an acute angle, with respect to the major axis of the active region 102, and are separated from each other by a predetermined distance. The gate electrodes 128 are electrically insulated from each other by interlayer insulation layers 230. The gate electrodes 128 may have the same 2-dimensional shape as the second mask pattern 118 shown in FIG. 5.

The gate electrodes 128 according to the second embodiment of the present invention are formed using a damascene process. Accordingly, an overlap margin required to form the gate electrodes 128 is sufficient. That is, the gate electrodes 128 fill the spaces above the second element isolation layer 122 and cover both side surfaces of the active regions 102. The fin-FET according to the second embodiment of the present invention has a double gate structure in which the gate electrodes 128 cover both sides of the active regions 102.

Each of the gate electrodes 128 may include a polysilicon layer, a silicide layer, and a capping insulation layer sequentially stacked. However, instead of the polysilicon layer, a monolayer or a multilayer composed of amorphous silicon, poly Si—Ge, and/or a material including metal can be used. The material including metal may include a metal such as tungsten or molybdenum or may include a conductive metal nitride, such as titanium nitride, tantalum nitride, or tungsten nitride. The silicide layer may or may not be included. The capping insulation layer may be formed of a material having a sufficient etch selectivity to an interlayer insulation layer which is deposited in a subsequent process, and may be, for example, a silicon nitride layer.

For convenience, the gate electrodes 128 can be divided into first electrodes 128a intersecting the active regions 102 and second electrodes 128b intersecting the first element isolation layer 120 disposed along the first direction. The top surfaces of the first element isolation layers 120 are at the same level or higher than the top surface of the active regions 102. The second electrodes 128b are disposed on the first element isolation layers 120, and thus the generation of leakage current in the semiconductor substrate 100 due to the electric power supplied to the second electrodes 128b can be prevented because the electric field produced by the second electrodes 128b is blocked by the first element isolation layers 120. Meanwhile, both ends of the second electrodes 128b are connected to the gate electrodes disposed on the second element isolation layers 122 to be extended.

The method of manufacturing a semiconductor device having vertical channels according to the present invention can prevent the generation of leakage current in the semiconductor substrate since gate electrodes are formed on element isolation layers which extend upward to the same level or higher than the top surfaces of active regions.

In addition, in the method of manufacturing a semiconductor device having vertical channels according to the present invention, gate electrodes are formed using a line shape mask pattern, thereby obtaining a sufficient overlap margin.

In addition, the gate electrode is manufactured using a damascene process, thereby significantly increasing an overlap margin.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
    a plurality of active regions protruding from a top surface of a semiconductor substrate wherein each of the plurality of active regions has a length in a first direction that is greater than a width in a second direction, and wherein the first direction is perpendicular with respect to the second direction, the active regions comprising a first pair of active regions spaced apart in the first direction and a second pair of active regions spaced apart in the second direction, the first pair including an active region included in the second pair;
    a first isolation layer between the first pair of active regions;
    a second isolation layer between the second pair of active regions; and
    an electrode on the first isolation layer, wherein a top surface of the first isolation layer is positioned higher than a top surface of the second isolation layer.

2. The semiconductor device of claim 1, wherein the top surface of the second isolation layer is positioned lower than top surfaces of the second pair of active regions.

3. The semiconductor device of claim 1, wherein the top surface of the first isolation layer is positioned on an equivalent level as or higher than top surfaces of the first pair of active regions.

4. The semiconductor device of claim 1, wherein the electrode includes a first portion on the first isolation layer and a second portion on one of the plurality of active regions protruding from the top surface of the semiconductor substrate, the second portion being thicker than the first portion.

5. The semiconductor device of claim 4, wherein the one of the plurality of active regions is spaced apart from other ones of the plurality of active regions in the second direction.

6. The semiconductor device of claim 2, further comprising a third isolation layer where no electrode is formed.

7. The semiconductor device of claim 6, wherein a top surface of the third isolation layer is on an equivalent level with the first isolation layer and is higher than the top surface of the second isolation layer, wherein the third isolation layer is between the second pair of active regions.

8. The semiconductor device of claim 7, wherein the top surface of the third isolation layer is on an equivalent level as or higher than the top surface of the first pair of active regions.

9. The semiconductor device of claim 1, wherein a gate insulation layer is directly on sidewalls of at least one of the second pair of the active regions.

10. The semiconductor device of claim 2, wherein a portion of the top surface of the second isolation layer is positioned lower than the top surface of the second pair of active regions.

11. A semiconductor device comprising:
a plurality of active regions protruding from a top surface of the semiconductor substrate wherein each of the plurality of active regions has a length in a first direction that is greater than a width in a second direction, and wherein the first direction is perpendicular with respect to the second direction, the active regions comprising a first pair of active regions spaced apart in the first direction and a second pair of active regions spaced apart in the second direction, the first pair including an active region included in the second pair;
a first isolation layer between the first pair of active regions;
a second isolation layer between the second pair of active regions; and
a first conductive pattern on the first isolation layer and a second conductive pattern on the second isolation layer and on the active region included in the first and second pairs, the first conductive pattern and the second conductive pattern extending in parallel, wherein a top surface of the first isolation layer is positioned higher than a top surface of the second isolation layer.

12. The semiconductor device of claim 11, wherein the top surface of the second isolation layer is positioned lower than top surfaces of the second pair of active regions.

13. The semiconductor device of claim 12, wherein the second conductive pattern comprises a gate electrode.

14. The semiconductor device of claim 13, wherein a source region is adjacent the second conductive pattern and wherein a top surface of the source region is higher than a portion of the second isolation layer.

15. The semiconductor device of claim 11, wherein a gate insulation layer is directly on sidewalls of at least one of the second pair of the active regions.

16. The semiconductor device of claim 11 wherein the first pair of active regions comprises a first active region and a second active region arranged along a first axis extending in the first direction, wherein the second pair of active regions comprises the second active region and a third active region, wherein the third active region is arranged along a second axis extending in the first direction, and wherein the first and second axes are spaced apart.

17. The semiconductor device of claim 11 wherein the first and second directions are orthogonal, wherein the first and second conductive patterns extend in a third direction that is different than the first direction and different than the second direction, and wherein the third direction is disposed along a width of at least one of the active regions.

18. The semiconductor device of claim 1 wherein the first pair of active regions comprises a first active region and a second active region arranged along a first axis extending in the first direction, wherein the second pair of active regions comprises the second active region and a third active region, wherein the third active region is arranged along a second axis extending in the first direction, and wherein the first and second axes are spaced apart.

19. The semiconductor device of claim 1 wherein the first and second directions are orthogonal, wherein the electrode extends in a third direction that is different than the first direction and different than the second direction, and wherein the third direction is disposed along a width of at least one of the active regions.

* * * * *

UNITED STATES PATENT AND TRADEMARK OFFICE
CERTIFICATE OF CORRECTION

PATENT NO. : 9,496,336 B2
APPLICATION NO. : 14/750027
DATED : November 15, 2016
INVENTOR(S) : Shin et al.

Page 1 of 1

It is certified that error appears in the above-identified patent and that said Letters Patent is hereby corrected as shown below:

In the Claims

At Column 11, Line 5:
"with the first isolation layer and is higher than the top surface"
Should read:
--with the top surface of the first isolation layer and is higher than the top surface--

At Column 11, Line 10:
"as or higher than the top surface of the first pair of active"
Should read:
--as or higher than top surfaces of the first pair of active--

At Column 11, Line 17:
"positioned lower than the top surface of the second pair of"
Should read:
--positioned lower than the top surfaces of the second pair of--

At Column 11, Line 21:
"of the semiconductor substrate wherein each of the"
Should read:
--of a semiconductor substrate wherein each of the--

Signed and Sealed this
Fourteenth Day of October, 2025

John A. Squires
*Director of the United States Patent and Trademark Office*